United States Patent
Chae et al.

(10) Patent No.: US 7,525,850 B2
(45) Date of Patent: Apr. 28, 2009

(54) MULTI-LEVEL NONVOLATILE SEMICONDUCTOR MEMORY DEVICE AND METHOD FOR READING THE SAME

(75) Inventors: Dong Hyuk Chae, Seoul (KR); Young Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/941,101

(22) Filed: Nov. 16, 2007

(65) Prior Publication Data

US 2008/0137443 A1 Jun. 12, 2008

Related U.S. Application Data

(62) Division of application No. 11/416,064, filed on May 3, 2006, now Pat. No. 7,313,020.

(30) Foreign Application Priority Data

May 4, 2005 (KR) .......................... 10-2005-37430

(51) Int. Cl.
*G11C 7/10* (2006.01)
(52) U.S. Cl. ..................... 365/189.05; 365/185.05; 365/185.18; 365/185.24; 365/185.23; 365/185.25; 365/189.08
(58) Field of Classification Search ............ 365/189.05, 365/189.08, 185.05, 185.18, 185.24, 185.23, 365/185.25
See application file for complete search history.

(56) References Cited

U.S. PATENT DOCUMENTS

| | | | | |
|---|---|---|---|---|
| 5,768,188 A | * | 6/1998 | Park et al. | 365/185.03 |
| 5,862,074 A | * | 1/1999 | Park | 365/185.03 |
| 5,930,172 A | * | 7/1999 | Kucera | 365/185.21 |
| 6,031,760 A | * | 2/2000 | Sakui et al. | 365/185.21 |
| 6,172,917 B1 | | 1/2001 | Kataoka et al. | |

(Continued)

FOREIGN PATENT DOCUMENTS

JP  11288596  10/1999

(Continued)

*Primary Examiner*—Viet Q Nguyen
(74) *Attorney, Agent, or Firm*—Volentine & Whitt, PLLC

(57) ABSTRACT

A nonvolatile semiconductor memory device is provided which includes a memory array, a page buffer, and a row decoder. The memory array includes a plurality of nonvolatile memory cells, a bit line, and a word line, and the row decoder driven to control the word line of the memory array. The page buffer is electrically connected to the bit line and includes a main data latch and a sub-data latch. The page buffer, which is configured such that flipping of the main data latch is inhibited according to a logic state of the sub-data latch, further includes a main latch block, a sub-latch block, and a latch control block. The main latch block drives the main data latch and maps a logic state of the main data latch to a threshold voltage of a corresponding memory cell through the bit line. The sub-latch block drives the sub-data latch, where the sub-data latch is flipped depending on the voltage level of the bit line. The latch control block selectively flips the main data latch depending on the voltage level of the bit line, where the latch control block is disabled depending on a logic state of the sub-data latch.

4 Claims, 16 Drawing Sheets

U.S. PATENT DOCUMENTS

| | | | | |
|---|---|---|---|---|
| 6,704,239 B2 * | 3/2004 | Cho et al. | ............... | 365/230.04 |
| 6,768,682 B2 * | 7/2004 | Yano et al. | ............... | 365/185.28 |
| 6,813,214 B2 * | 11/2004 | Cho et al. | ............... | 365/230.04 |
| 6,826,082 B2 * | 11/2004 | Hwang et al. | ........... | 365/185.17 |
| 7,298,648 B2 * | 11/2007 | Lee et al. | ................ | 365/185.03 |
| 7,313,020 B2 * | 12/2007 | Chae et al. | ............. | 365/185.03 |
| 7,342,827 B2 * | 3/2008 | Park et al. | ............... | 365/185.12 |
| 7,366,033 B2 * | 4/2008 | Park et al. | ............... | 365/189.05 |
| 7,372,767 B2 * | 5/2008 | Kim | ....................... | 365/230.06 |
| 2006/0120152 A1 | 6/2006 | Lee et al. | | |

FOREIGN PATENT DOCUMENTS

| | | |
|---|---|---|
| JP | 2000222894 | 8/2000 |
| KR | 1020010077273 A | 8/2001 |

* cited by examiner

STATE TRANSITION DIAGRAM OF MDLT AND SDLT
(IN CASE OF PROGRAM SUCCESS)

|  | MSB/LSB | AFTER INITIAL READ (MDLT/SDLT) | AFTER FIRST VERIFY READ (MDLT/SDLT) | AFTER SECOND VERIFY READ MDLT |
|---|---|---|---|---|
| CASE1 | 1/1 | H/L | H/L | H |
| CASE2 | 1/0 | H/H | H/H | H |
| CASE3 | 0/0 | L/H | H/H | H |
| CASE4 | 0/1 | L/L | L/L | H |

FIG. 11

MULTI-LEVEL NONVOLATILE SEMICONDUCTOR MEMORY DEVICE AND METHOD FOR READING THE SAME

CROSS-REFERENCE TO RELATED APPLICATIONS

This is a divisional of application Ser. No. 11/416,064, filed May 3, 2006, now U.S. Pat. No. 7,313,020 which is incorporated herein by reference in its entirety.

BACKGROUND OF THE INVENTION

1. Field of the Invention

The present invention generally relates to nonvolatile semiconductor memory devices and, more particularly, the present invention relates to nonvolatile semiconductor memory devices having multi-level memory cells, and to methods of reading data from nonvolatile semiconductor memory devices.

A claim of priority is made to Korean Patent Application 10-2005-37430, filed on May 4 ,2005, the subject matter of which is hereby incorporated by reference in its entirety.

2. Description of the Related Art

A nonvolatile semiconductor memory device has the capability of retaining stored data even when power is not supplied tote device. Several types of memory cells suitable for use in a nonvolatile semiconductor memory device are well known, one of which is a single transistor-type memory cell as illustrated in FIG. 1.

As shown in FIG. 1, a single transistor-type memory cell MC generally includes a source S and a drain D on a semiconductor wafer, a control gate CG, and a floating gate FG formed between a dielectric oxide DOX and a gate oxide GOX. The floating gate FG traps electrons, and the trapped electrons are used to establish the threshold voltage of memory cell MC. When the nonvolatile semiconductor memory device performs a read operation, the data value stored in memory cell MC is determined by sensing the threshold voltage of memory cell MC.

Typically, in the memory cells MC of a nonvolatile semiconductor memory device, a program operation and an erase operation can be performed repeatedly. In this case, several functions of the single transistor-type memory cells MC are determined by various voltages applied thereto. Each single transistor-type memory cell MC is programmed by causing electrons to move to the floating gate FG. The electrons moving to the floating gate FG are generated by Fowler-Nordheim tunneling (FN), electron injection, etc. Electron injection is performed by channel hot-electron injection (CHE), channel-initiated secondary electron injection (CISEI), etc. Further, Fowler-Nordheim tunneling (FN) is generally used in flash memory devices for erasing data all at once.

A single transistor-type memory cell, such as memory cell MC, typically stores one of two possible threshold voltage levels. A memory cell that stores one of two possible threshold voltage levels will be refereed to herein as a 2-level memory cell. As shown in FIG. 2, a data value in a 2-level memory cell is represented by a threshold voltage set to one of two levels. For example, if threshold voltage of memory cell MC is lower than a reference voltage VR, its data value is read as "1", and if the threshold voltage of memory cell MC is higher than reference voltage VR, its data value is read as "0".

In order to increase the integration degree of memory device, a 4-level memory cell has been developed. As shown in FIG. 3, a 4-level memory cell can be programmed to one of four threshold voltage groups. Consequently, the 4-level memory cell can store data having any one of four values. Therefore, a nonvolatile semiconductor memory device having 4-level memory cells (hereinafter referred to as a "multi-level nonvolatile semiconductor memory device") has a data storage capacity that is about two times the storage capacity of a nonvolatile semiconductor memory device having 2-level memory cells.

Generally, in the memory cells of a conventional multi-level nonvolatile semiconductor memory device, each threshold voltage group corresponds to one of the two-bit data values "11," "10," "01," and "00." As shown in FIG. 2, the threshold voltage group corresponding to "11" has the lowest threshold voltage among the threshold voltage groups, the threshold voltage group corresponding to "10" has a greater threshold voltage than the threshold voltage group corresponding to "11," the threshold voltage group corresponding to "01" has a greater threshold voltage than the threshold voltage group corresponding to "10," and the threshold voltage group corresponding to "00" has a greater threshold voltage than the voltage group corresponding to "01." The threshold voltage groups can be identified using first, second, and third reference voltages VR1, VR2, and VR3, respectively, wherein first reference voltage VR1 is less than second reference voltage VR2, and second reference voltage VR2 is less than third reference voltage VR3. When reading the LSB (east significant bit) of a data value, a bit line sensing process includes applying each of the first through third reference voltages VR1 through VR3 to the gate terminal of a selected memory cell and mapping the threshold voltage of the selected memory cell to a bit line.

The conventional multi-level nonvolatile semiconductor memory device includes a sequence of operations which precharge each bit line to a predetermined precharge voltage before the bit line sensing process is executed. This sequence of precharge operations of the conventional multi-level nonvolatile memory device is disadvantageous in that it takes a relatively long time to execute.

SUMMARY OF THE INVENTION

According to an aspect of the present invention, a nonvolatile semiconductor memory device is provided which includes a memory array, a page buffer, and a row decoder. The memory array includes a plurality of nonvolatile memory cells, a bit line, and a word line, and the row decoder driven to control the word line of the memory array. The page buffer is electrically connected to the bit line and includes a main data latch and a sub-data latch. The page buffer, which is configured such that flipping of the main data latch is inhibited according to a logic state of the sub-data latch, further includes a main latch block, a sub-latch block, and a latch control block. The main latch block drives the main data latch and maps a logic state of the main data latch to a threshold voltage of a corresponding memory cell through the bit line. The sub-latch block drives the sub-data latch, where the sub-data latch is flipped depending on the voltage level of the bit line. The latch control block selectively flips the main data latch depending on the voltage level of the bit line, where the latch control block is disabled depending on a logic state of the sub-data latch.

According to another aspect of the present invention, a data reading method is provided for a nonvolatile semiconductor memory device including a plurality of memory cells, each memory cell having any one threshold voltage of first to fourth threshold voltage groups classified according to first to third reference voltages that sequentially increase according to data stored in the memory cell. The method includes primarily mapping the threshold voltage of the memory cell to a bit line on the basis of the first or second reference voltage, performing a primary flip operation to flip a main data latch depending on a voltage level of the bit line based on the primary mapping, secondarily mapping the threshold voltage of the memory cell to the primarily mapped bit line on the basis of the third reference voltage, and performing a secondary flip operation to flip the main data latch depending on the voltage level of the bit line based on the secondary mapping.

BRIEF DESCRIPTION OF THE DRAWINGS

The above and other aspects and features of the present invention will become readily apparent from the detailed description that follows, with reference to the accompanying drawings, in which:

FIG. 11 shows variations in main latch data and sub-latch data during the MSB program operation of FIG. 9;

DETAILED DESCRIPTION OF THE PREFERRED EMBODIMENTS

Figure 4:
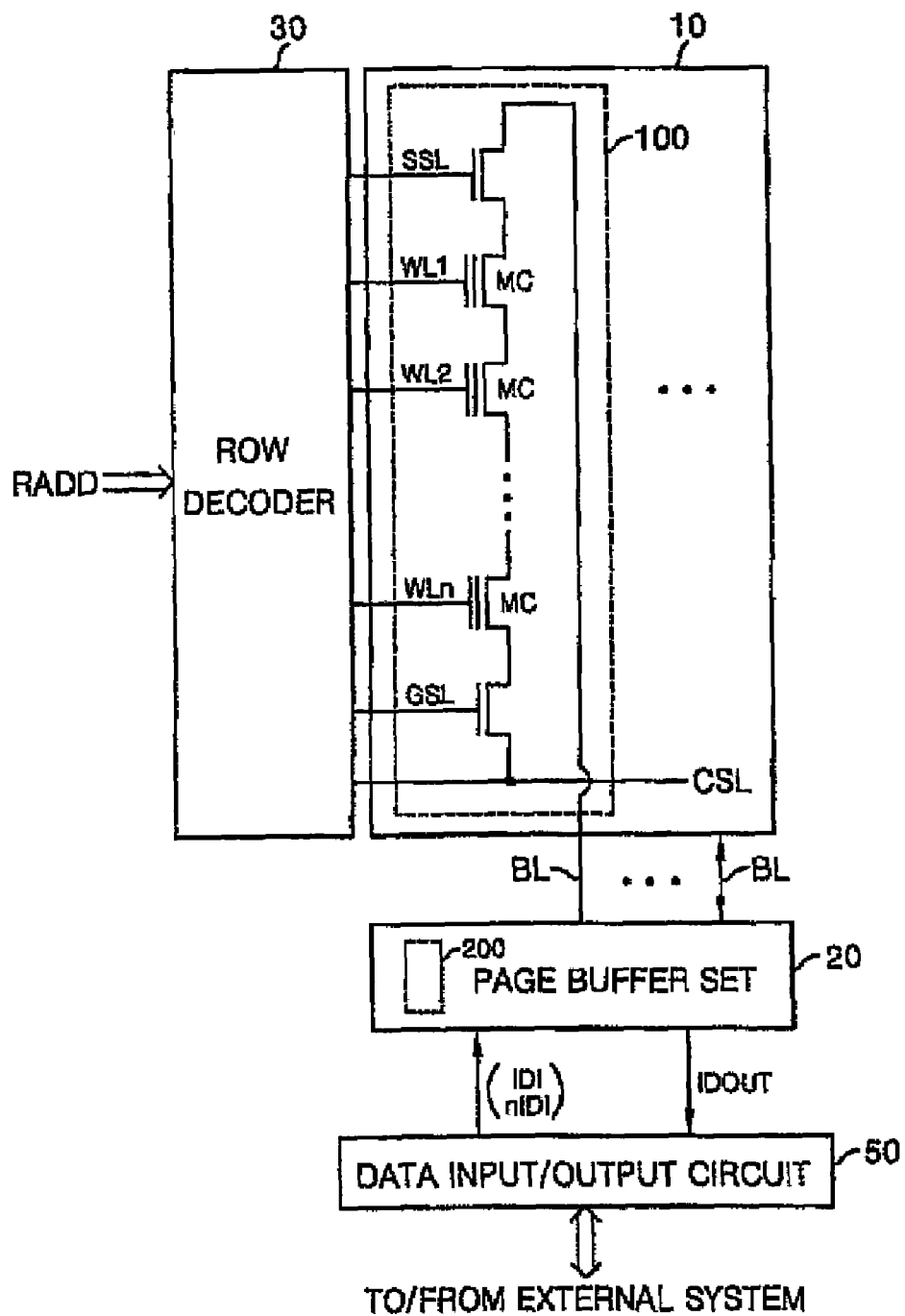
FIG. 4 is a diagram showing a nonvolatile semiconductor memory device in accordance with an embodiment of the invention.

FIG. 4 is a diagram showing a nonvolatile semiconductor memory device in accordance with an embodiment of the present invention. Referring to FIG. 4, the nonvolatile semiconductor memory device generally includes a memory array 10, a page buffer set 20 and a row decoder 30.

The memory array 10 includes a plurality of strings 100 electrically connected to respective bit lines BL. Each string 100 includes a plurality of memory cells MC having control gates connected to respective word lines WL <1–n>. Also, at one end of each string 100 is a string select transistor connected to a string select line SSL, and at the other end of each string 100 is connected a ground select transistor connected to a ground select line GSL. In operation, row address data RADD is decoded by the row decoder 30 so as to select (or activate) one of the memory cells MC of the string 100 to transmit read and write data through the bit line BL. The read and write data is temporality latched in a page buffer set 20, which generally includes a separate page buffer circuit 200 for each bit line BL (or bit line pair, discussed below). The write data (which may be represented by complimentary internal data IDI and nIDI) latched in the page buffer set 20 is received from an external system via a data input/output circuit 50. The read data (IDOUT) latched in the page buffer set 20 is output to the external system via the data input/output interface 50.

It should be understood that FIG. 4 simplified for convenience of description, and that the configuration can be modified to have various arrangements. For example, two strings 100 connected to the same bit line BL and the same word line WL may form a single pair. In this case, when one string is accessed, the other string performs a shielding function to prevent noise. In the structure in which two strings form a single pair in this way, various types of control circuits for selecting and controlling a string to be accessed and a string to perform shielding are provided. The technical scope of the present invention is not limited to the construction and control circuits of strings 100 shown in FIG. 4.

Figure 5:
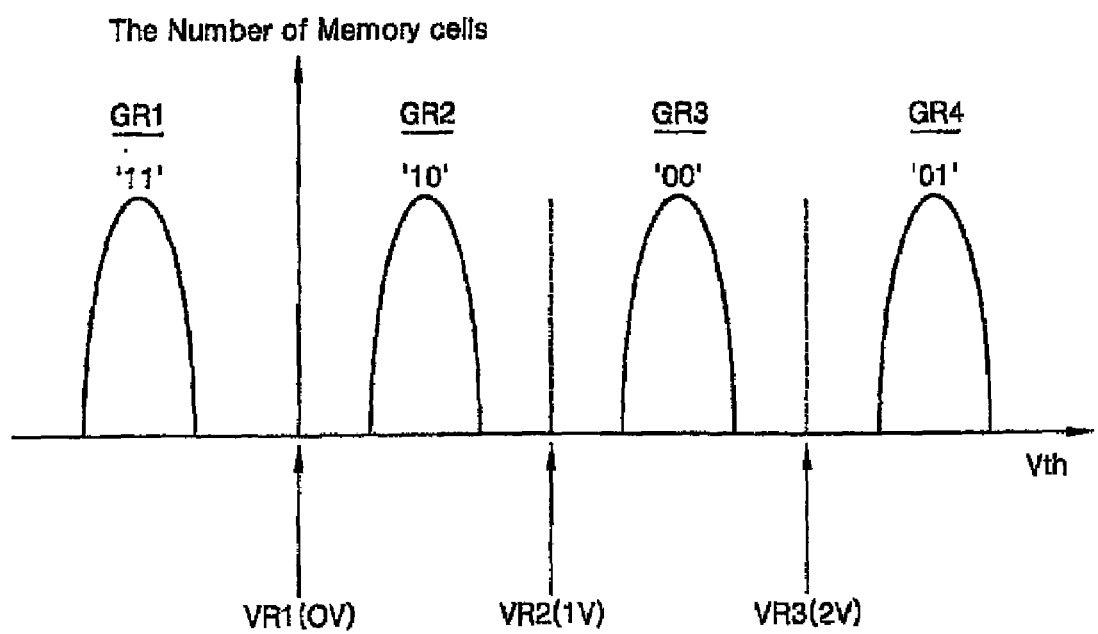
FIG. 5 shows the distribution of threshold voltages of the 4-level memory cells of the nonvolatile semiconductor memory device of FIG. 4 in accordance with an embodiment of the present invention.

FIG. 5 shows the distribution of threshold voltages of the 4-level memory cells of the nonvolatile semiconductor memory device of FIG. 4 in accordance with an embodiment of the present invention. Referring to FIG. 5, the memory cells MC can be programmed to a threshold voltage within a first, a second, a third, or a fourth threshold voltage group GR1, GR2, GR3, or GR4, respectively, wherein first threshold voltage group GR1 has a lesser threshold voltage than second threshold voltage group GR2, second threshold voltage group GR2 has a lesser threshold voltage than third threshold voltage group GR3, and third threshold voltage group GR3 has a lesser threshold voltage than fourth threshold voltage group GR4. In this embodiment, first through fourth threshold voltage groups GR1 through GR4 may be discriminated using first, second, and third reference voltages VR1, VR2, and VR3, respectively.

As shown in FIG. 5, a two-bit data value comprising a first bit and a second bit corresponds to each of the four threshold voltage groups, and thus, each threshold voltage group represents a two-bit data value. For each data value, the first bit will be referred to as "BIT1," and the second bit will be referred to as "BIT2." Data values "11," "10," "00," and "01" will correspond to first, second third, and fourth threshold voltage groups GR1, GR2, GR3, and GR4, respectively. Further, for each data value, the first digit of the data value is the most significant bit (MSB), and the second digit of the data value is the least significant bit (LSB). For the data value "10", for example, "1" is the MSB and "0" is the LSB. For convenience of description it will be assumed in the present specification that first bit BIT1 refers to the LSB, and that second bit BIT2 reds to the MSB. However, second bit BIT2 may refer to the LSB while first bit BIT1 refers to the MSB.

Figure 1:
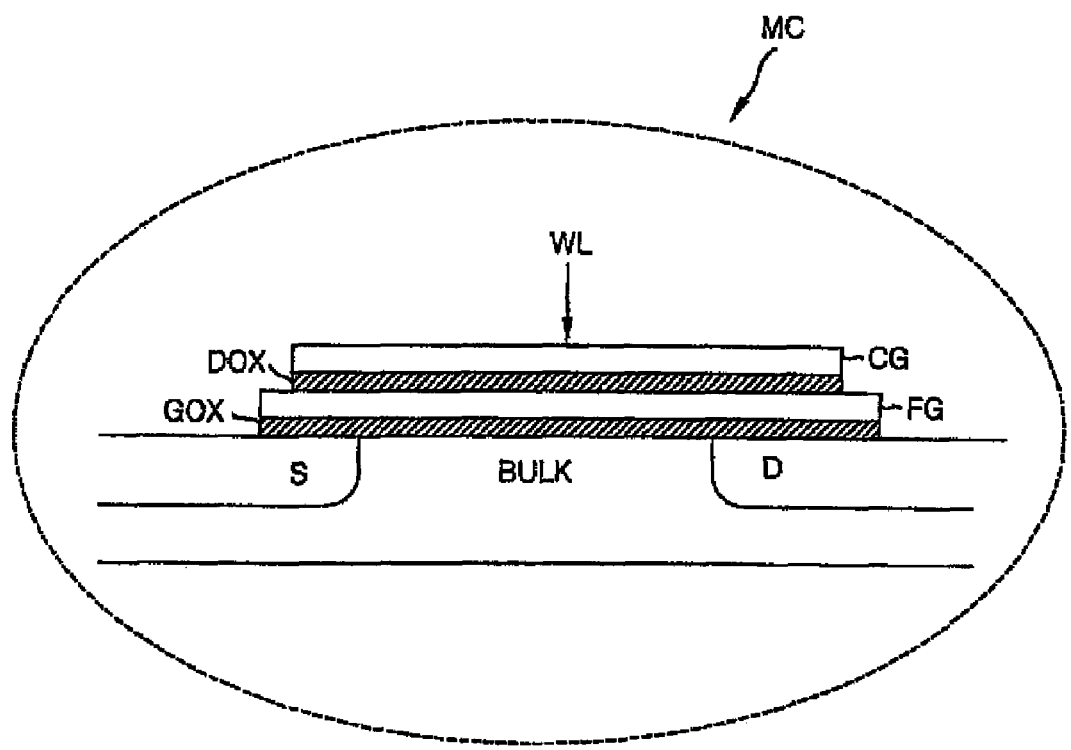
FIG. 1 is a cross sectional view showing a typical single transistor-type memory cell.
Figure 2:
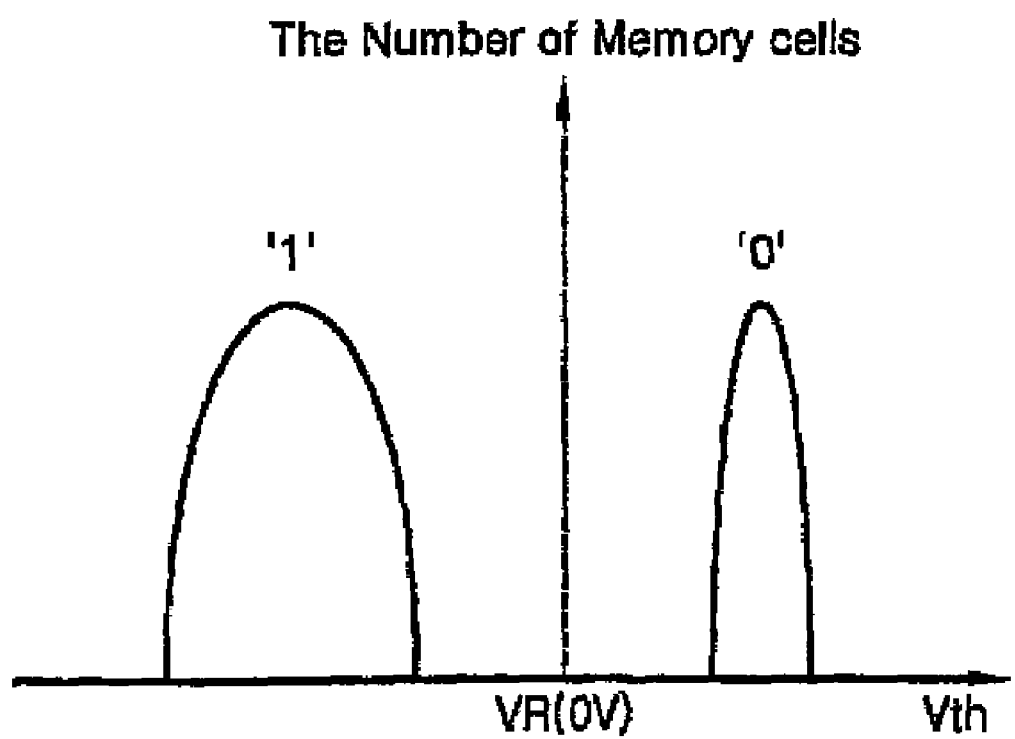
FIG. 2 shows the distribution of the threshold voltages of a conventional 2-level memory cell.
Figure 3:
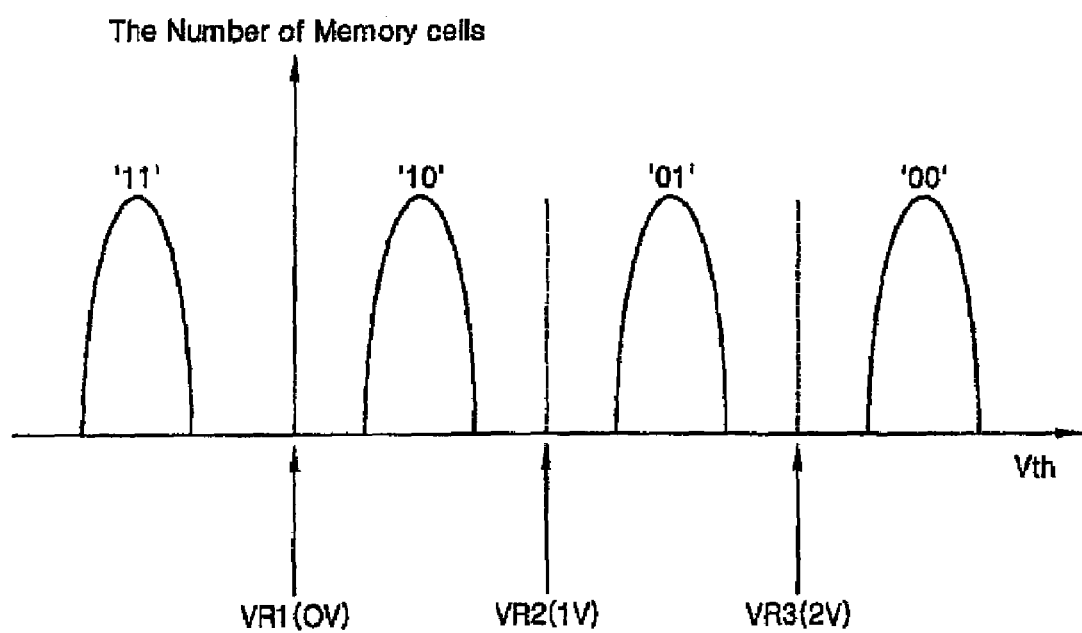
FIG. 3 shows the distribution of the threshold voltages of a conventional 4-level memory cell.

Still referring to FIG. 5, if the data value corresponding to first threshold voltage group GR1 has the same LSB as the data value corresponding to the fourth threshold voltage group GR4, the LSB of the data value stored in a memory cell may be read with two bit line sensing operations, where one bit line sensing operation uses first reference voltage VR1, and the other uses third reference voltage VR3. In contrast three bit line sensing operations are required in order to read the LSB of the data value stored in a memory cell when the data values are mapped as shown in FIG. 3. Thus, when the data values correspond to the threshold voltage groups as shown in FIG. 5, the read time is reduced relative to the case where the data values correspond to the threshold voltage groups as shown in FIG. 3.

When performing a verify read operation to verify whether a program operation has succeeded, the respective voltage levels of first through third reference voltages VR1 through VR3 may differ from the voltage levels utilized when performing a normal read operation to read stored data. However, for convenience of description, it will be assumed hereafter that the respective voltage levels of first through third reference voltages VR1 through VR3 are the same when performing the verify read operation as when performing the normal read operation. This assumption is only made for convenience of description, and the technical scope of the present invention is not limited to this assumption.

Figure 6:
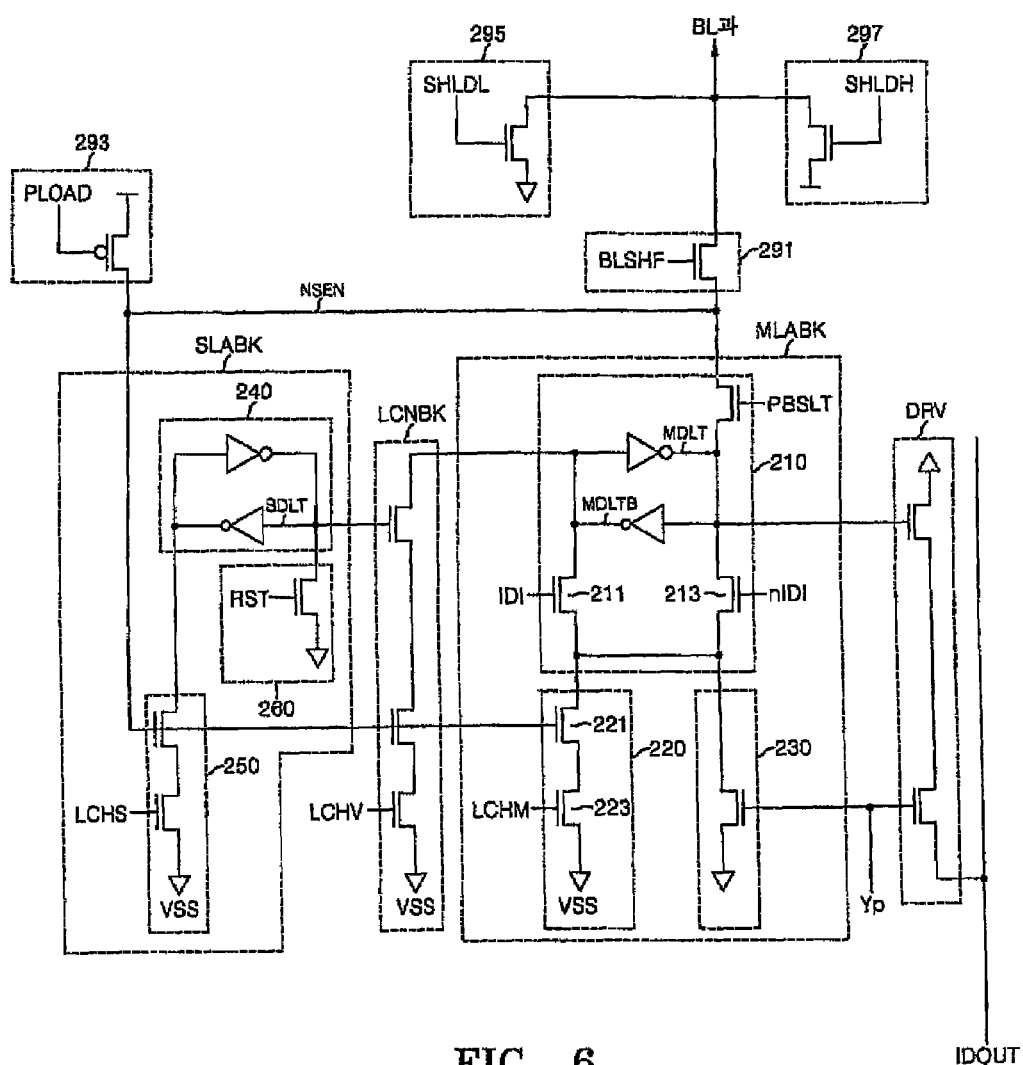
FIG. 6 is a circuit diagram showing a page buff of the page buffer set shown in FIG. 4 in accordance with an embodiment of the present invention.

FIG. 6 is a circuit diagram of a page buffer 200 of the page buffer set 20 illustrated in FIG. 4.

Referring to FIG. 6, the page buffer 200 is adapted to store main latch data MDLT and sub-latch data SDLT. The main latch data MDLT and sub-latch data SDLT may be inverted (flipped) in accordance with the voltage level of bit line BL. However, the inversion of main latch data MDLT may be interrupted in accordance with sub-latch data SDLT.

The page buffer 200 is adapted to control the threshold voltage of memory cell MC in accordance with the LSB and the MSB of a data value during the program operation of the nonvolatile semiconductor memory device. The operation of page buffer 200 during the program operation of the nonvolatile semiconductor memory device in accordance with the present invention will be described in detail later.

Referring to FIG. 6, page buffer 200 includes a main latch block MLABK, a sub-latch block SLABK, and a latch control block LCNBK.

The main latch block MLABK latches main latch data MDLT. The latched main latch data MDLT is then mapped to the bit line BL. Further, the main latch data MDLT is selectively inverted in accordance with the voltage level of a sensing terminal NSEN, that is, the bit line BL.

The sub-latch block SLABK latches sub-latch data SDLT, and the sub-latch data SDLT is selectively inverted in accordance with the voltage level of the bit line BL.

The latch control block LCNBK inverts the main latch data MDLT in accordance with the voltage level of the bit line BL, and is disabled in accordance with the logic level of the sub-latch data SDLT. In this embodiment, when the sub-latch data SDLT has a logic low level, the latch control block LCNBK does not invert the main latch data MDLT.

The main latch block MLABK includes a main latch unit 210, a main response unit 220, and a loading unit 230. The main latch unit 210 stores the main latch data MDLT. In this embodiment, the main latch unit 210 maps the main latch data MDLT to the bit line BL in accordance with a buffer selection signal PBSLT. In the present embodiment, the main latch data MDLT is mapped to the bit line BL through a bit line shielding unit 291 when a bit line shielding signal BLSHF is set to a logic high level.

The main response unit 220 is enabled in response to a main latch signal LCHM. The main response unit 220 inverts the man latch data MDLT latched in the main latch unit 210 in accordance with the voltage level of the sensing terminal NSEN, that is, the bit line BL. The main response unit 220 inverts the main latch data MDLT of main latch unit 210 in accordance with the voltage level of the bit line BL, regardless of the logic level of the sub-latch data SDLT. In this case, internal data IDI and inverted internal data nIDI, which gate transistors 211 and 213, respectively, control the logic level that the main latch data MDLT will have after its inversion, if the inversion of the main lath data MDLT is to take place. If the inversion is to take place and the main latch data MDLT already has the logic level to which main latch data is to be inverted, in accordance with the internal data IDI and the inverted internal data nIDI, then the main latch data MDLT will simply maintain that logic level.

Preferably, the main response unit 220 comprises transistors 221 and 223 that invert the main latch data MDLT of the main latch unit 210. The transistor 221 is gated in accordance with the voltage level of sensing terminal NSEN, that is, the bit line BL. The transistor 223 is gated by the main latch signal LCHM and is connected in series with the transistor 221.

The inversion of the main latch data MDLT by the main response unit 220 will now be described. If the initial latched level of the main latch data MDLT is a logic low level, the internal data IDI is set to a logic high level to invert the main latch data MDLT. If the voltage level of the sensing terminal NSEN approaches a supply voltage VCC, the inverted main latch data MDLTB, which is the inversion of the main latch data MDLT, is adjusted to a logic low level of the ground voltage VSS. Therefore, the main latch data MDLT is inverted to a logic high level.

If the voltage level of the sensing terminal NSEN approaches the ground voltage VSS, the transistor 221 is turned off. Therefore, the main latch data MDLT is not inverted, but instead maintains its initial latched level.

Further, if the initial latched level of the main latch data MDLT is a logic high level, and internal data IDI is set to a logic high level, the main latch data MDLT maintains its initial latched level, regardless of the voltage level of sensing terminal NSEN. However, if inverted internal data nIDI, which is the inversion of internal data IDI, is set to a logic high level, the main latch data MDLT may be inverted from its initial logic high level to a logic low level by the main response unit 220.

Further, the loading unit 230 loads specific data into the main latch unit 210 in accordance with a predetermined selection address Yp and the internal data pair IDI and nIDI. If the internal data IDI is set to a logic high level, the main latch data MDLT is loaded at a logic high level. If the internal data IDI is set to a logic low level, that is, if the inverted internal data nIDI is set to a logic high level, then the main latch data MDLT is loaded at a logic low level. So, the logic level of the main latch data MDLT loaded by the loading unit 230 is controlled by the logic level of the internal data pair IDI and nIDI, which gate the transistors 211 and 213.

Sub-latch block SLABK includes a sub-latch unit 240, a sub-response unit 250, and a reset unit 260. The sub-latch unit 240 stores the sub-latch data SDLT. Further, the sub-response unit 250 is enabled in response to a sub-latch signal LCHS. The sub-response unit 250 inverts the sub-latch data SDLT latched in the sub-latch unit 240 in accordance with the voltage level of the bit line BL.

The inversion of the sub-latch data SDLT by the sub-response unit 250 is similar to the inversion of the main latch data MDLT from a logic low level to a logic high level by the main response unit 220, so a detailed description thereof is omitted here to avoid redundancy.

The reset unit 260 resets the sub-latch data SDLT to a logic low level in response to a predetermined reset control signal RST.

The latch control block LCNBK inverts the main latch data MDLT from a logic low level to a logic high level in accordance with the voltage level of the bit line BL, and is disabled when the sub-latch data SDLT has a logic low level. In this embodiment, when the sub-latch data SDLT has a logic low level, the inversion of the main latch data MDLT by the latch control block LCNBK is interrupted.

When the sub-latch data SDLT is inverted to a logic high level, the invasion of the main latch data MDLT by the latch control block LCNBK selectively occurs. This inversion is similar to the inversion of the main latch data MDLT from a logic low level to a logic high level by the main response unit 220, so a detailed description thereof is omitted here to avoid redundancy.

In accordance with an embodiment of the present invention, the page buffer 200 further includes an output driver DRV which maps the main latch data MDLT to a predetermined internal data line IDOUT. If the main latch data MDLT has a logic high level, the internal data line IDOUT is adjusted to a logic low level when the selection address Yp is set to a logic high level. In contrast, if the main latch data MDLT has a logic low level, the internal data line IDOUT maintains a previously precharged logic high level even if the selection address Yp is set to a logic high level.

Referring to FIG. 6, the page buffer 200 further includes a bit line shielding unit 291, a sensing precharge with 293, a bit line discharge unit 295, and a bit line precharge unit 297.

The bit line shielding unit 291 controls the connection of the bit line BL to the sensing terminal NSEN in accordance with a bit line shielding signal BLSHF. In other words, the sensing terminal NSEN is selectively connected to the bit line BL through the bit line shielding unit 291.

The sensing precharge unit 293 precharges the sensing node NSEN to the supply voltage VCC in response to a sensing precharge signal PLOAD.

In this embodiment, if the bit line shielding signal BLSHF is set to a logic high level, the bit line BL is precharged to a predetermined precharge voltage when the sensing terminal NSEN is precharged to the supply voltage VCC. In contrast, if the bit line shielding signal BLSHF has a logic low level, the bit line BL is not precharged, even if the sensing terminal NSEN is precharged to the supply voltage VCC.

The bit line discharge unit 295 discharges the bit line BL to the ground voltage VSS in accordance with a bit line discharge signal SHLDL. Further, the bitline precharge unit 297 precharges the bit line BL to the supply voltage VCC in accordance with a bit line precharge signal SHLDH.

Described next is a data program method for a nonvolatile semiconductor memory device according to an embodiment of the present invention. The data program method includes successive execution of two sub-programs, namely, an LSB program operation (FIGS. 7 and 8, discussed next) followed by an MSB program operation (FIGS. 9-11, discussed later). In the LSB program operation, the threshold voltage of the memory cell MC is primarily controlled according to the LSB data. Next, in the MSB program operation, the threshold voltage of the memory cell MC is secondarily controlled according to the MSB data is secondarily controlled subject to the primary control of the threshold voltage executed in the LSB program operation.

Figure 7:
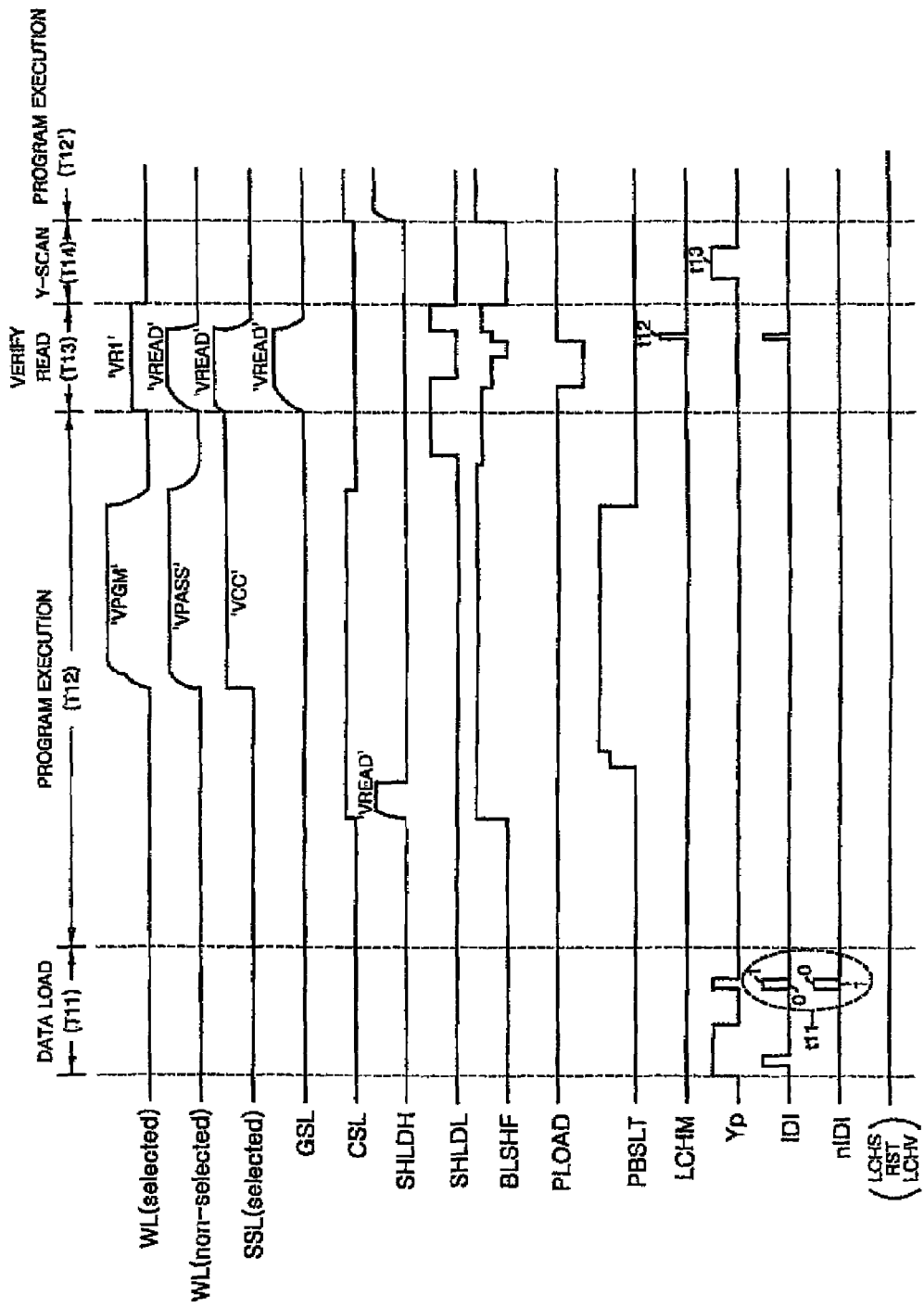
FIGS. 7 and 8 are a timing diagram and a data flow diagram, respectively, illustrating an LSB (least significant bit) program method for an embodiment of the nonvolatile semiconductor memory device of the present invention.
Figure 8:
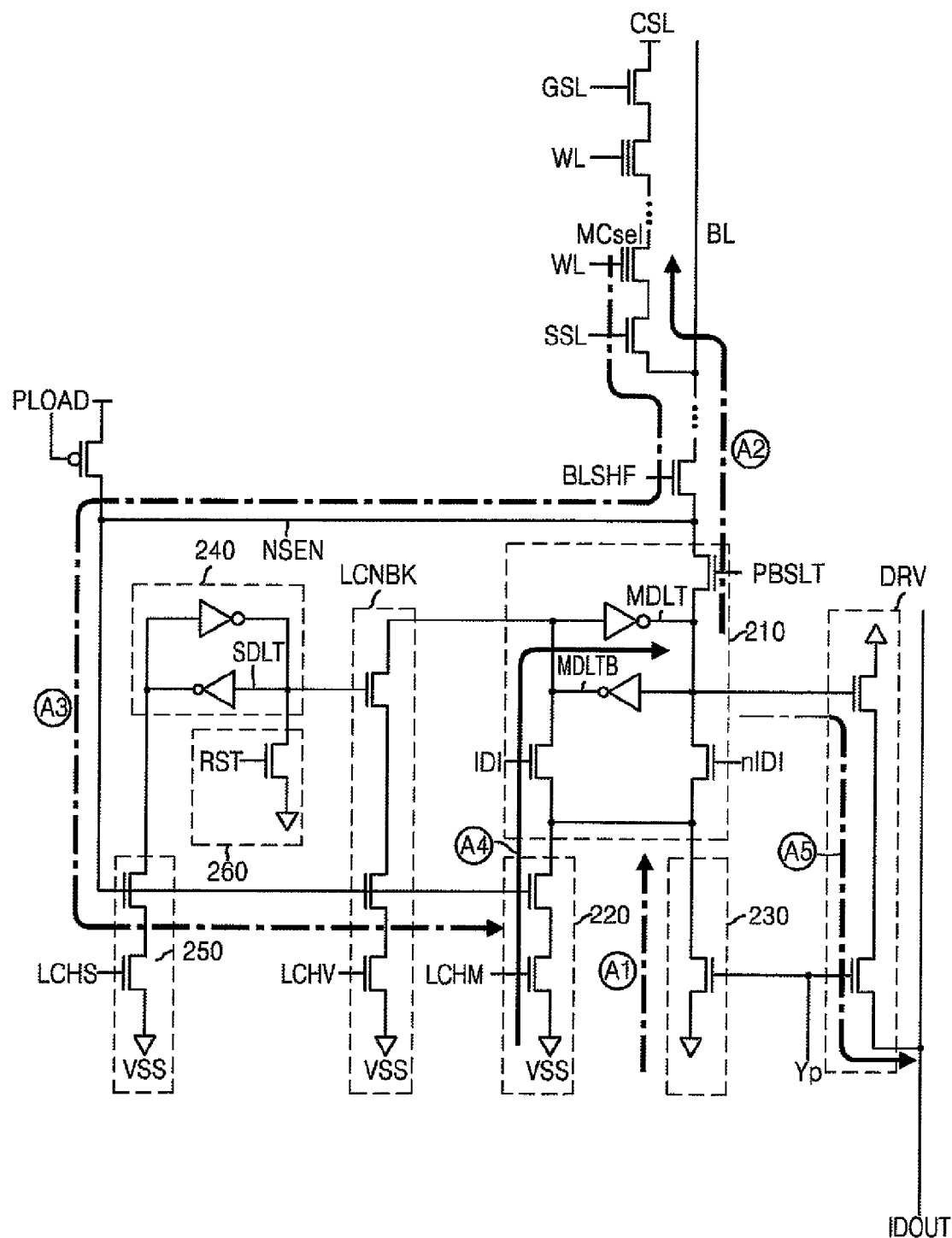
Figure 9:
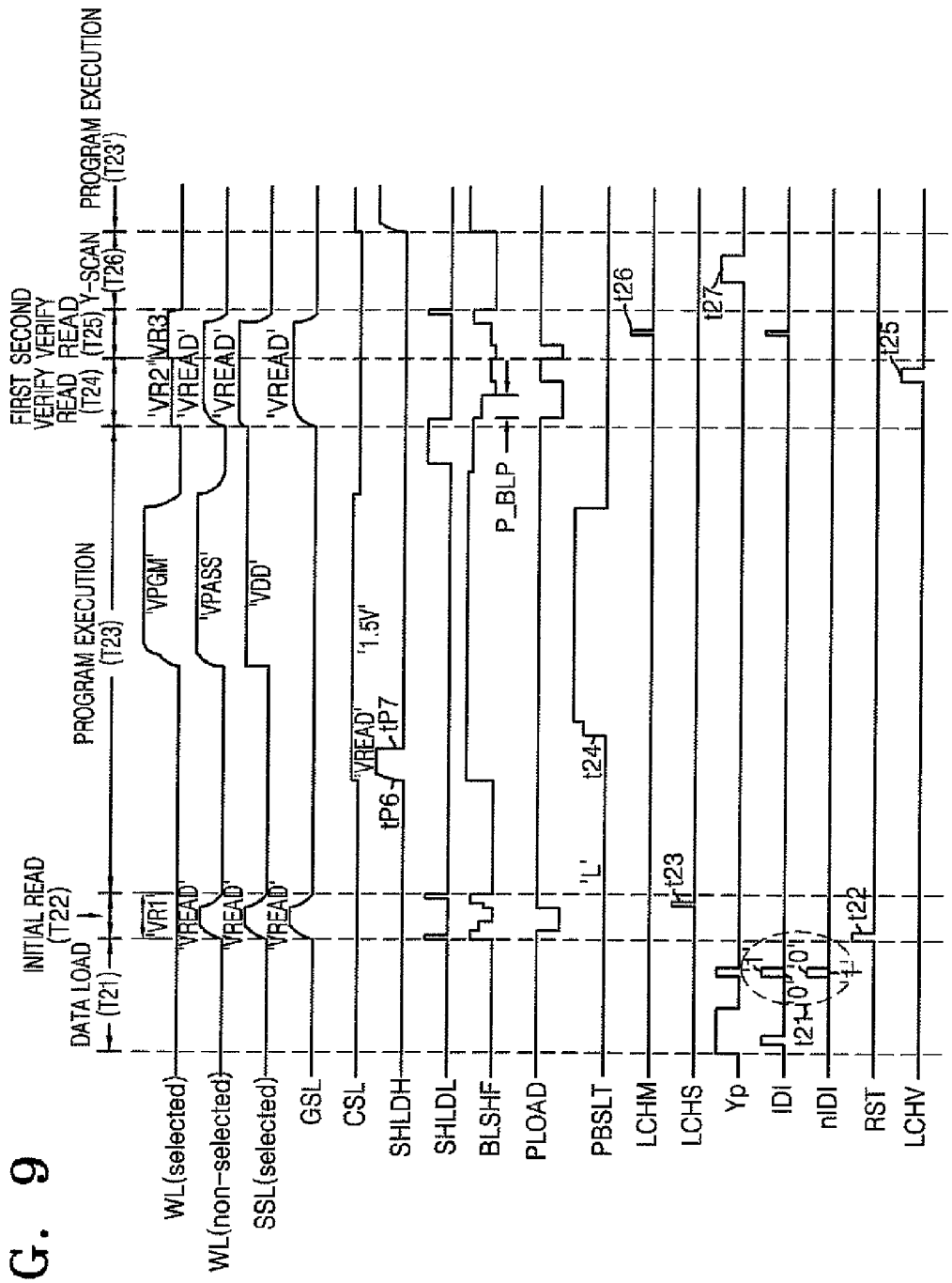
FIG. 9 is a timing diagram showing an MSB (most significant bit) program operation for an embodiment of the nonvolatile semiconductor memory device of the present invention.

FIGS. 7 and 8 are a timing diagram and a data flow diagram, respectively, of a lower bit (LSB) program operation for a nonvolatile semiconductor memory device according to an embodiment of the present invention. In the LSB program operation, the threshold voltage of a memory cell MCsel is controlled using a lower bit (LSB). Herein, "MCsel" denotes a selected memory cell MC.

Referring collectively to FIGS. 7 and 8, during a data load interval T11, an LSB is loaded as main latch data MDLT by the loading unit 230 (A1 of FIG. 8). That is, if the LSB is "0" the inverted data nIDI of the internal data IDI is adjusted to a logic high level, so that the main latch data MDLT is latched as a logic low level. In contras, if the LSB is "1", the internal data IDI is adjusted to a logic high level, so that the main latch data MDLT maintains a logic high level (t11).

During a program execution interval T12, the program operation of the memory cell MCsel is executed using the main latch data MDLT (A2 of FIG. 8). If an LSB is "0", the threshold voltage of the memory cell MCsel increases, while if the LSB is "1", the threshold voltage of the memory cell MCsel maintains its previous state.

Next, during a verify read interval T13, it is determined whether the memory cell MCsel has been programmed to a threshold voltage equal to or greater than a first reference voltage VR1. The threshold voltage of the memory cell MCsel based on the determination of whether the threshold voltage is equal to or greater than the first reference voltage VR1 is mapped to the sensing terminal NSEN (A3 of FIG. 8). Further, when the main latch signal LCHM and the internal data IDI are generated as high pulses (t12), the main latch data MDLT is selectively flipped depending on the mapped voltage of the sensing terminal NSEN (A4 of FIG. 8).

Next during a Y-scan interval T14, if the selection address Yp is generated as a high level (t13), it is determined whether the memory cell MCsel has been programmed to the first reference voltage VR1 or above (refer to A5 of FIG. 8).

If a LSB program operation has succeeded, the memory cell MCsel is an off-cell that is turned off during the verify read interval T13. In this case, the sensing terminal NSEN is adjusted to the supply voltage VCC, and the main latch data MDLT is flipped from a logic low level to a logic high level. During the subsequent Y-scan interval T14, data having a logic low level is output through the internal data line IDOOUT, so that it is verified that the program operation has succeeded.

If a program operation has failed, the memory cell MCsel is an on-cell that is turned on during the verity read interval T13. At this time, the sensing terminal NSEN is adjusted to the ground voltage VSS, and the main latch data MDLT maintains the logic low state without change. During the subsequent Y-scan interval T14, data having a logic high level is output through the internal data line IDOUT, in which case it can be verified that the program operation has failed. In this case, the program operation starting from the program execution interval T12 is repeatedly performed. That is, an Incremental Step Pulse Programming (ISPP) procedure is performed.

Further, if the LSB is "1", the main latch data MDLT maintains a high level during the verify read interval T13. Therefore during the Y-scan interval T14, data having a logic low level is output through the internal data line IDOUT.

The MSB program operation according to an embodiment of the present invention is described next with reference to FIGS. 9-11.

Figure 10A:
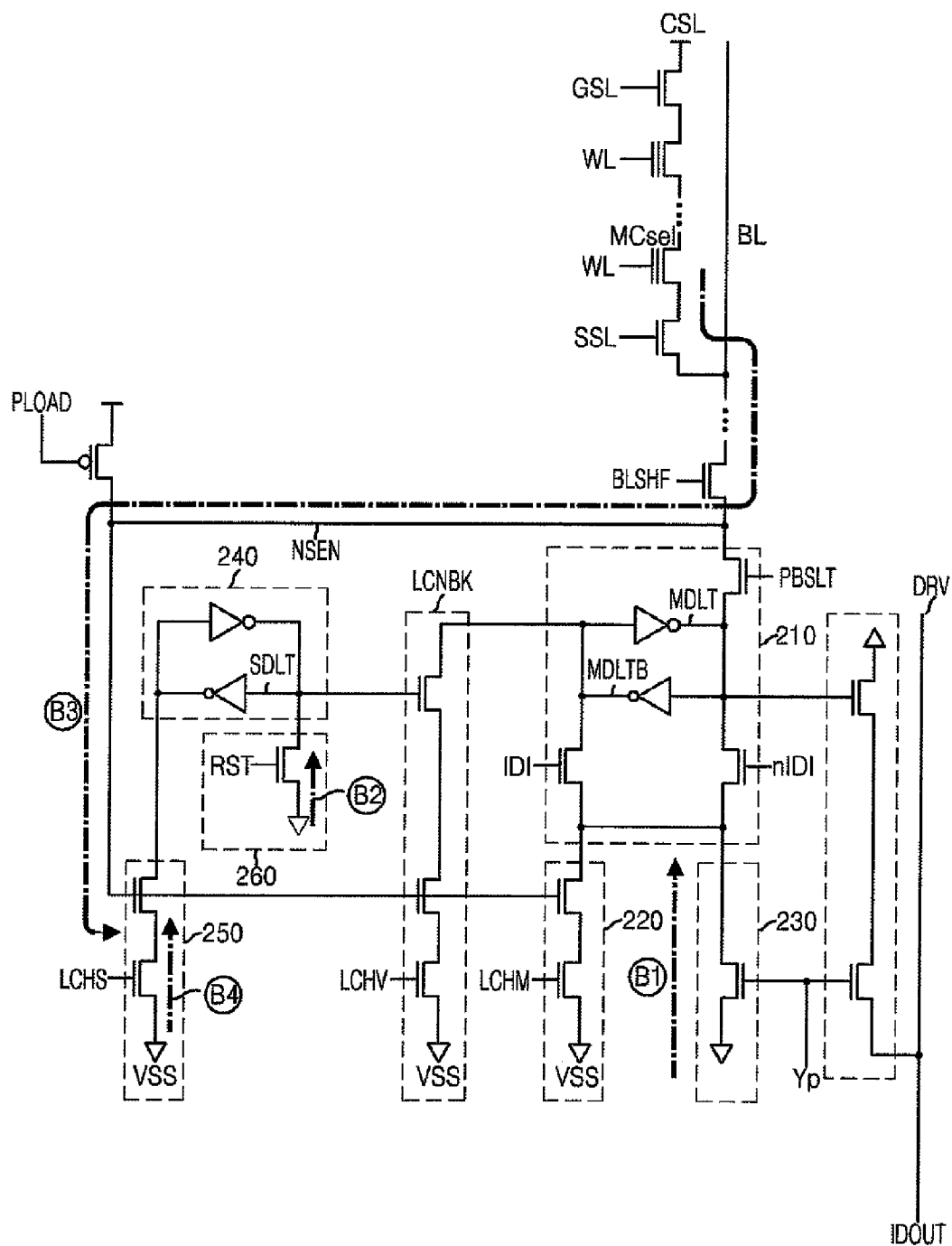
FIGS. 10a and 10b are data flow diagrams based on the timing diagram of FIG. 9.
Figure 10B:
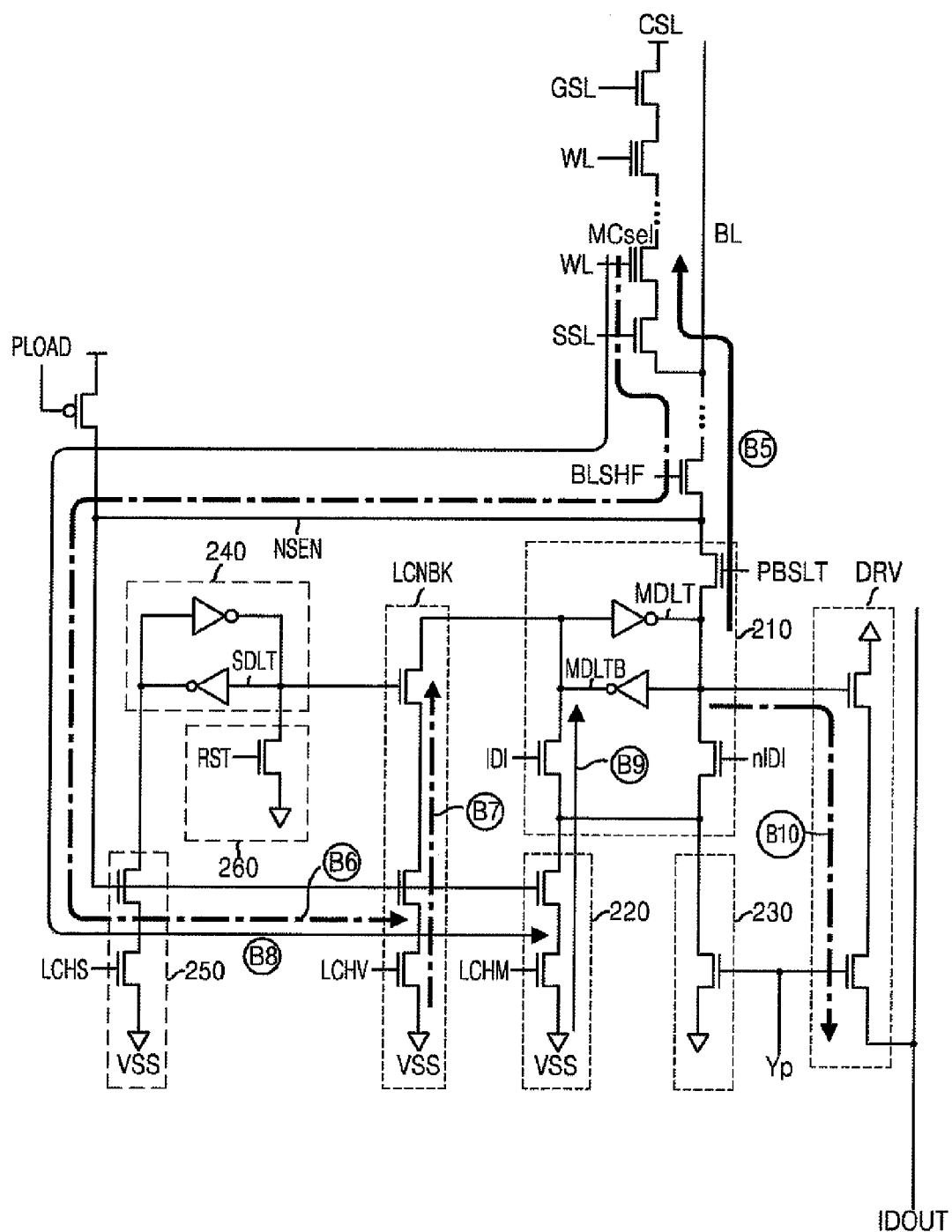

FIG. 9 is a timing diagram of the MSB program operation, FIGS. 10a and 10b are data flow diagrams based on the timing diagram of FIG. 9, and FIG. 11 is a view showing variations in main latch data MDLT and sub-latch data SDLT during the MSB program operation of FIG. 9.

Referring collectively to FIGS. 9, 10a and 10b, during a data load interval T21, an MSB is loaded as the main latch data MDLT (B1 of FIG. 10a). That is, if an MSB is "0", the main latch data MDLT is latched as a logic low level. In contrast, if the MSB is "1", the main latch data MDLT maintains a logic high level (t21).

Thereafter, during an initial read interval T22, the sub-latch data SDLT is adjusted to a predetermined logic state according to the threshold voltage of the memory cell MCsel in which the LSB program operation has been performed. The initial read interval T22 will be described in detail. First, if the reset control signal RST is activated as a high pulse (t22), the sub-latch data SDLT is reset to a logic low level (B2 of FIG. 10a). Further, the first reference voltage VR1 (0V in the present embodiment) is applied to the memory cell MCsel, so that the threshold voltage of the memory cell MCsel is mapped to the voltage level of the sensing terminal NSEN (B3 of FIG. 10a). Further, if the sub-latch signal LCHS is generated as a high pulse (t23), the sub-latch data SDLT is selectively flipped depending on the voltage of the sensing terminal NSEN (B4 of FIG. 10a).

Referring now to FIG. 11, conditions for flipping of the sub-latch data SDLT during the initial read interval T22 are described below.

If the previous data is "1" (that is, if the LSB is "1"), the memory cell MCsel is an on-cell. In this case, the sensing terminal NSEN is adjusted to the ground voltage VSS, and the sub-latch data SDLT maintains a logic low state ("after initial read" in CASE 1 and CASE 4 of FIG. 11).

In contrast, if the previous data is "0" (that is, if the LSB is "0"), the memory cell MCsel is an off-cell. In this case, the sensing terminal NSEN is adjusted to the supply voltage VCC, and the sub-latch data SDLT is flipped from a low level to a high level ("after initial read" in CASE 2 and CASE 3 of FIG. 11).

Returning to FIGS. 9, 10a and 10b, a program execution interval T23 is performed next. During the program execution interval T23, if the buffer selection signal PBSLT is activated (t24), the threshold voltage of the memory cell MCsel is controlled by the main latch data MDLT (B5 of FIG. 10b).

Further, during a first verify read interval T24, it is determined whether the memory cell MCsel has been programmed to a threshold voltage equal to or greater than the second reference voltage VR2. That is, the determination of whether the threshold voltage of the memory cell MCsel is equal to or greater than the second reference voltage VR2 is primary mapped to the bit line BL and the sensing terminal NSEN (B6 of FIG. 10b). Next, a reference latch signal LCHV is generated as a high pulse (t25), so that the main latch data MDLT is selectively flipped depending on the mapped voltage of the sensing terminal NSEN (B7 of FIG. 10b). In this case, if the sub-latch data SDLT is logic low, the flipping of the main latch data MDLT does not occur.

Further, during a second verify read interval T25, it is determined whether the memory cell MCsel has been programmed to a threshold voltage equal to or greater than the third reference voltage VR3. That is, the determination of whether the threshold voltage of the memory cell MCsel is equal to or greater than the third reference voltage VR3 is secondarily mapped to the bit line BL and the sensing terminal NSEN (B8 of FIG. 10b).

Then, a main latch signal LCHM is generated as a high pulse (t26), so that the main latch data MDLT is selectively flipped depending on the mapped voltage of the sensing terminal NSEN (B9 of FIG. 10b).

Thereafter, during a Y-scan interval T26, if the selection address Yp is activated to a logic high level (t27), the success or failure of the program operation is verified. Further, if failure of the program operation has been verified, a procedure starting from a program execution interval T23 is repeatedly performed.

Referring again to FIG. 11, flipping of the main latch data MDLT during the first and second verify read intervals T24 and T25 is described in detail.

CASE 1 and CASE 2 denote the case in which an MSB is "1". In this case, the main latch data MDLT maintains a logic high state during the first and second verify read intervals T24 and T25.

CASE 3 denotes the case in which both an MSB and an LSB are "0". In this case, if the MSB program operation succeeds, the main latch data MDLT is flipped from a low level to a high level during the first verify read interval T24. If the program operation fails, the main latch data MDLT maintains a logic low level without being flipped to a logic high level during the first and second verify read intervals T24 and T25.

CASE 4 denotes the case in which an MSB is "0" and an LSB is "1". In this case, during the first verify read interval T24, flipping of the main latch data MDLT to a logic high level does not occur. This is because the sub-latch data SDLT is logic low. Further, if the MSB program operation succeeds, the main latch data MDLT is flipped from a logic low level to a logic high level during the second verify read interval T25. If the program operation fails, the main latch data MDLT maintains a logic low state without being flipped to a logic high level during the first and second verify read intervals T24 and T25.

In summary, if the program operation succeeds, the main latch data MDLT is flipped to a logic high level during the first or second verify read interval T24 or T25. In contrast, if the program operation fails, the main latch data MDLT is not flipped during the first and second verify read intervals T24 and T25.

In the meantime, if the first verify read interval T24, during which primary mapping is performed, is compared, in detail, to the second verify read interval T25, during which secondary mapping is performed, the following difference can be observed.

During the first verify read interval T24, a precharge procedure P_BLP for precharging the bit line BL to a predetermined precharge voltage VPRE is performed. That is, during the first verify read interval T24, the bit line shielding signal BLSHF is changed to a logic high level (P_BLP1) while the sensing terminal NSEN is precharged to the supply voltage VCC. That is, during the first verify read interval T24, the bit line BL is precharged to the precharge voltage VPRE, and then the threshold voltage of the memory cell MCsel is mapped to the bit line BL.

In contrast, during the second verify read interval T25, the threshold voltage of the memory cell MCsel is mapped to the bit line BL without a separate precharge procedure. That is, the secondary mapping during the second verify read interval T25 is performed on the bit line BL, on which the primary mapping is performed during the first verify read interval T24, without a separate precharge procedure.

In the MSB program method for the nonvolatile semiconductor memory device of an embodiment of the present invention, an operation of precharging the bit line BE before or during the second verify read interval T25 can be omitted for the reasons described next.

First, if the data is "00" or "01", the memory cell MCsel is an off-cell during the first verify read interval T24. Therefore, the bit line BL maintains its previous precharge level before the second verify read interval T25. That is, the bit line BL is in a state equal to a precharged state.

If the data is "11" or "10", the main latch data MDLT is adjusted to a logic high level during the first verify read interval T24. Therefore, the verification of whether the main latch data MDLT is flipped during the second verify read interval T25 does not influence a read data value. Therefore, when data is "11" or "10", the second verify read interval T25 is not concerned.

Consequently, in the program verify and read method for the nonvolatile semiconductor memory device of the embodiment of the present invention, an operation of precharging the bit line BL before or during the second verify read interval T25 can be omitted.

In the meantime, the embodiment of FIG. 9 shows that the threshold voltage of the memory cell MCsel is mapped after the sensing terminal NSEN is adjusted to the supply voltage VCC during the second verify read interval T25. However, in products having low noise or low leakage current, the adjustment of the sensing terminal NSEN to the supply voltage VCC can be omitted.

The principles of the program operation, the verify read operation and the Y-scan operation during intervals T23 to T26 will be readily appreciated by those skilled in the art, and accordingly, a detailed description thereof is omitted.

A data reading method for a nonvolatile semiconductor memory device according to an embodiment of the present invention is described next with reference to FIGS. 12-14.

Figure 12:
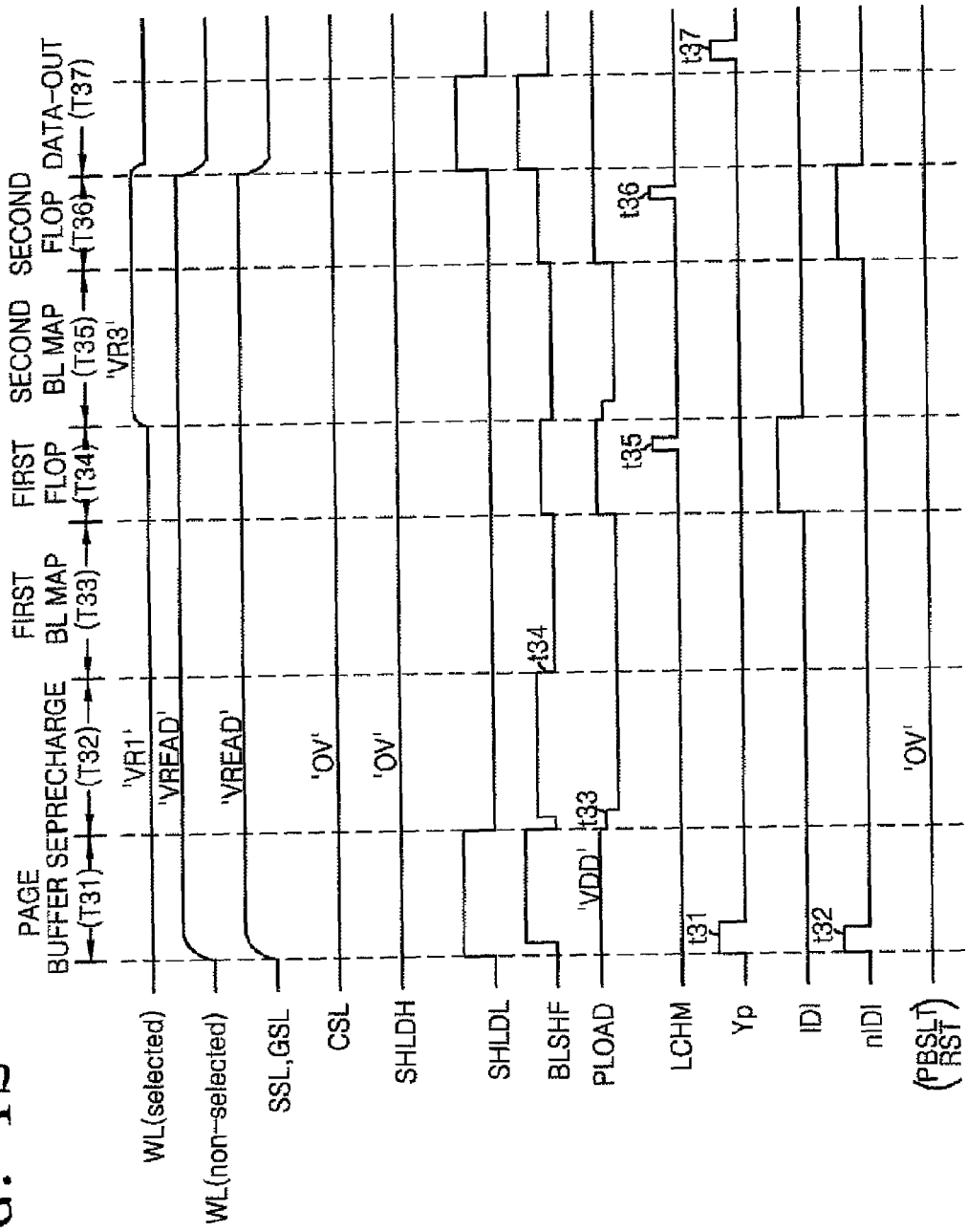
FIG. 12 is a timing diagram showing a method of reading an LSB from an embodiment of the nonvolatile semiconductor memory device of the present invention.
Figure 13A:
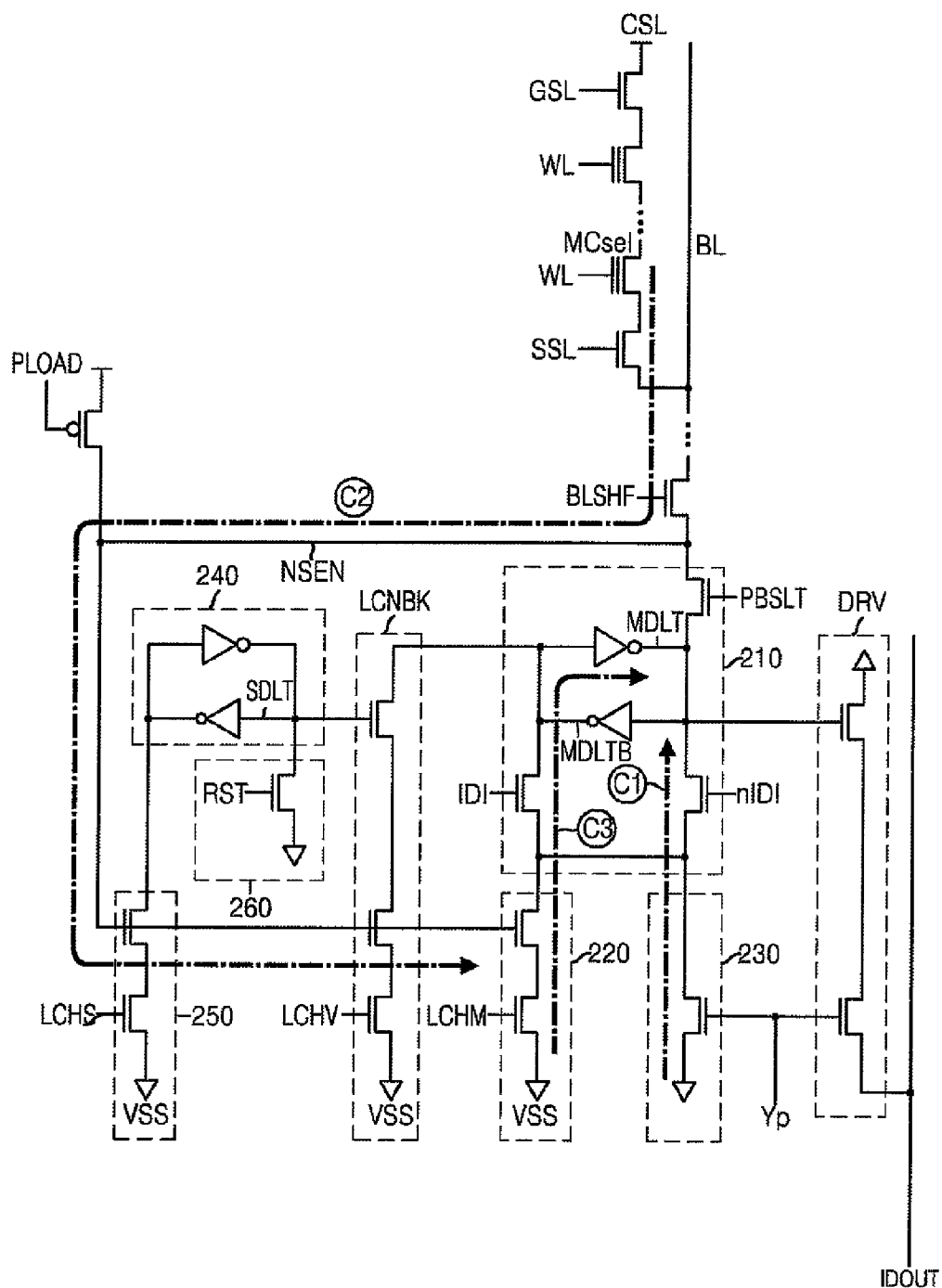
FIGS. 13a and 13b are data flow diagrams based on the timing diagram of FIG. 12.
Figure 13B:
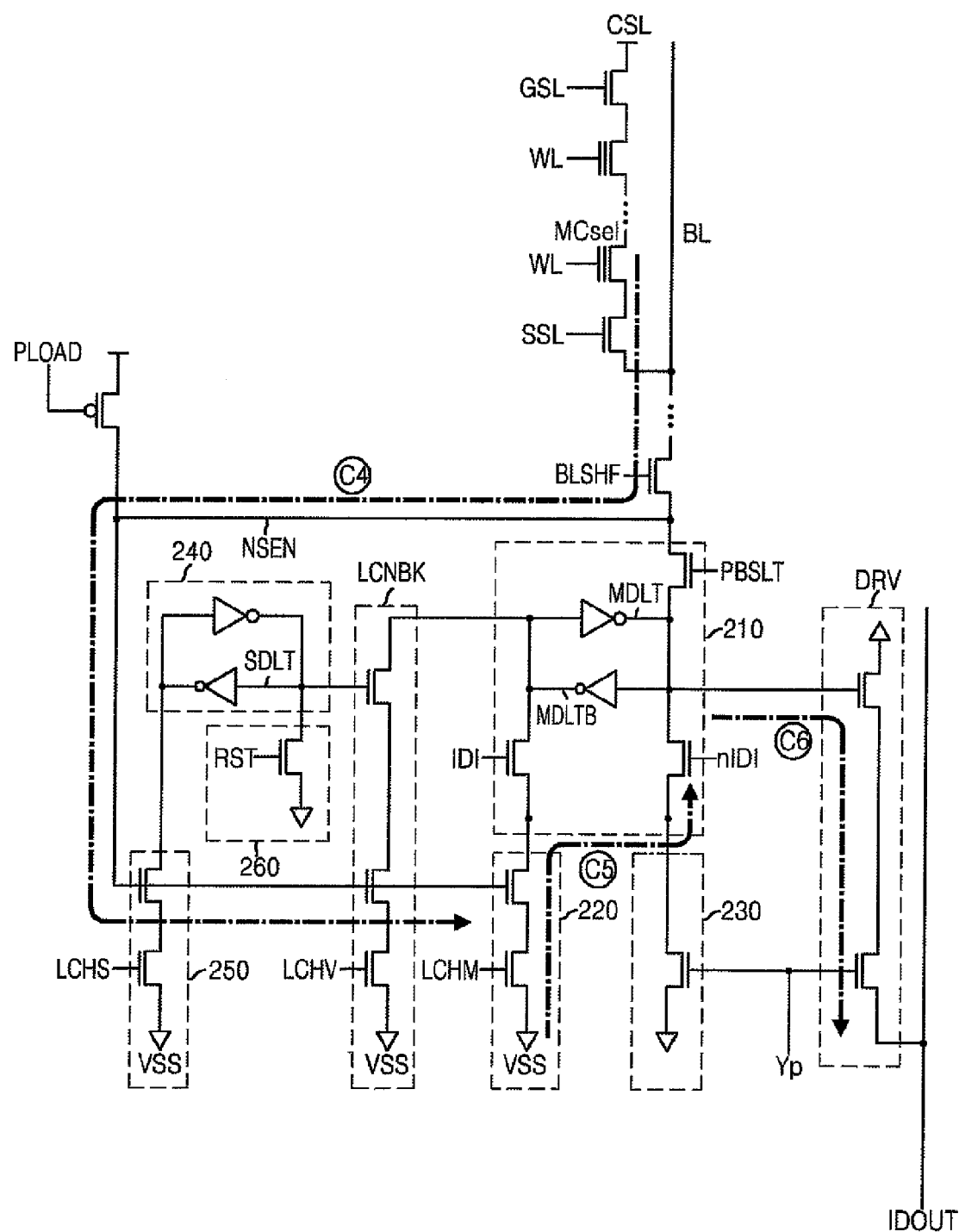
Figure 14:
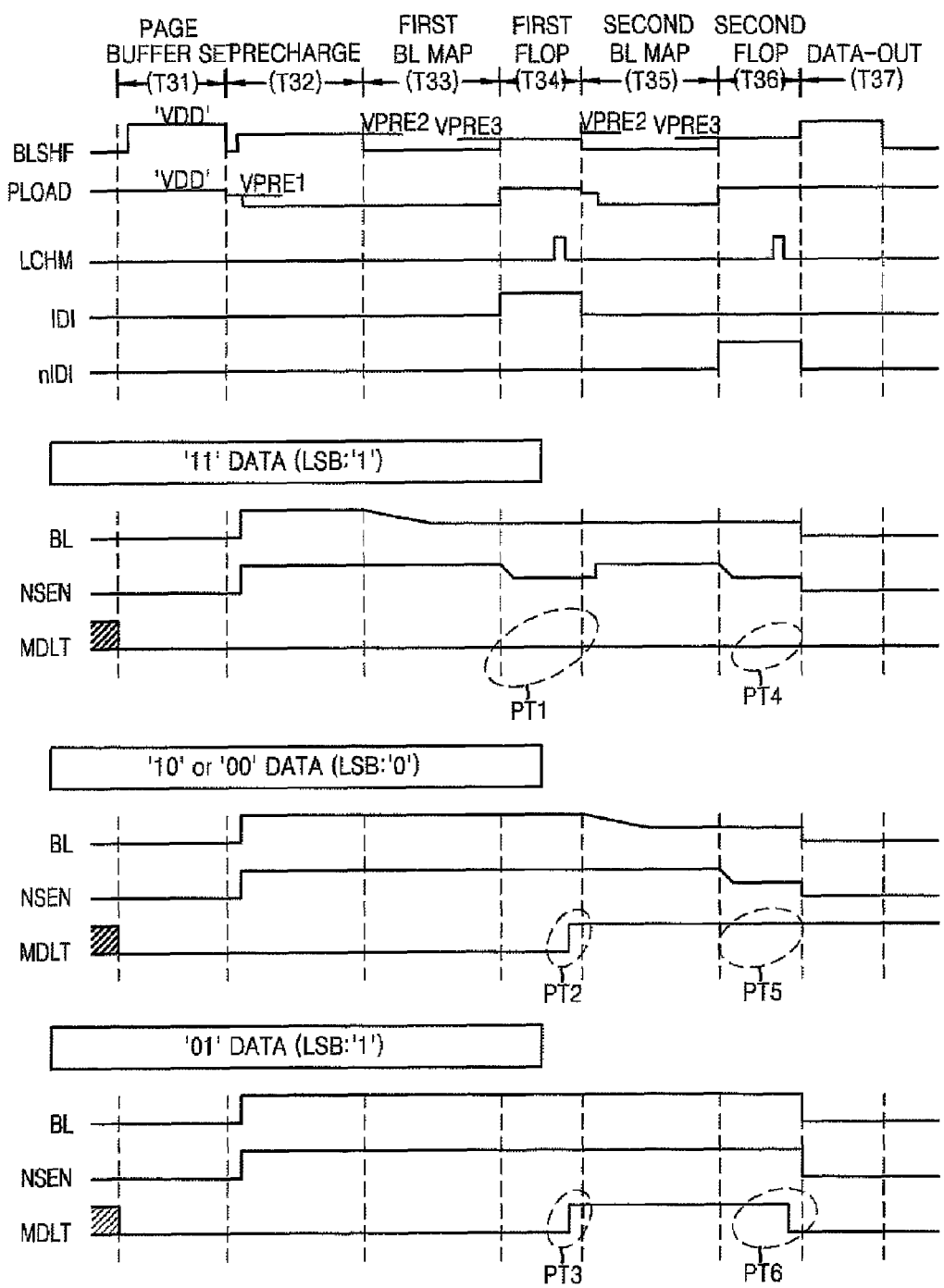
FIG. 14 shows variations in principal signals during the operation of reading an LSB as in the timing diagram of FIG. 12.

FIG. 12 is a timing diagram showing a method of reading an LSB data, FIGS. 13a and 13b are data flow diagrams based on the timing diagram of FIG. 12, and FIG. 14 is a view showing variations in principal signals at the time of the LSB reading of FIG. 12.

Referring collectively to FIGS. 12, 13a, 13b and 14, the reading of an LSB of a nonvolatile semiconductor memory device is implemented through a page buffer set interval T31, a precharge interval T32, a first bit line mapping interval (first BL map) T33, a first flip interval T34, a second bit line mapping interval (second BL map) T35, a second flip interval T36, and a data-out interval T37.

During the page buffer set interval T31, the selection address Yp and the inverted internal data nIDI are activated to a logic high level (t31, t32), so that the main latch data MDLT is latched as a logic low level (C1 of FIG. 13a).

During the precharge interval T32, the sensing precharge signal PLOAD is changed to a logic low level (t33), so that the sensing terminal NSEN is precharged to the supply voltage VCC, and the bit line BL is precharged to a predetermined precharge voltage.

During the first bit line mapping interval (fit BL map) T33, the bit line shielding signal BLSHF is adjusted to a logic low level (t34). At this time, the first reference voltage VR1 is applied to the gate terminal of the memory cell MCsel. Then, the threshold voltage of the memory cell MCsel based on the first reference voltage VR1 is primarily mapped to the bit line BL and the sensing terminal NSEN (of FIG. 13a).

Thereafter, during the first flip interval T34, the internal data IDI is logic high. Therefore, if the main latch signal LCHM is generated as a high pulse (t35), the main latch data MDLT is selectively flipped to a logic high level depending on the mapped voltage of the sensing terminal NSEN (C3 of FIG. 13a).

In this case, if the data in the memory cell MCsel is "11", the memory cell MCsel is an "on-cell", so the voltage level of the sensing terminal NSEN approaches the ground voltage VSS. Therefore, even if the main latch signal LCHM is generated as a high pulse, the main latch data MDLT maintains a logic low level (refer to PT1 of FIG. 14).

Further, if data in the memory cell MCsel is "10," "00" or "01", the memory cell MCsel is an off-cell, so the voltage level of the sensing terminal NSEN approaches the supply voltage VCC. Therefore, when the main latch signal LCHM is generated as a high pulse (t35), the main latch data MDLT is flipped from a logic low level to a logic high level (PT2 and PT3 of FIG. 14).

Next, during the second bit line mapping interval (second BL map) T35, the third reference voltage VR3 is applied to the gate terminal of the memory cell MCsel. Then, the threshold voltage of the memory cell MCsel based on the third reference voltage VR3 is secondarily mapped both to the bit line BL and the sensing terminal NSEN to which the threshold voltage of the memory cell MCsel has been primarily mapped (C4 of FIG. 13b).

Thereafter, during the second flip interval T36, the inverted internal data nIDI is logic high. Therefore, if the main latch signal LCHM is generated as a high pulse (t36), the flipping of the main latch data MDLT to a logic low level is selectively and secondarily performed depending on the mapped voltage of the sensing terminal NSEN (C5 of FIG. 13b).

In this case, if the data in the memory cell MCsel is "11", the main latch data MDLT is already in a logic low state, so that flipping does not occur (PT4 of FIG. 14).

Further, if data in the memory cell MCsel is "10" or "00", the memory cell MCsel is an on-cell. Therefore, the voltage level of the sensing terminal NSEN approaches the ground voltage VSS. Therefore, even if the main latch signal LCHM is generated as a high pulse, the main latch data MDLT maintains a high level (PT5 of FIG. 14).

Meanwhile, if the data in the memory cell MCsel is "01" the memory cell MCsel is an off-cell, so that the voltage level of the sensing terminal NSEN approaches the supply voltage VCC. Therefore, when the main latch signal LCHM is generated as a high pulse (t36), the main latch data MDLT is flipped from a logic high level to a logic low level (PT6 of FIG. 14).

Consequently, if an LSB is "1" after the second flip interval T36 has elapsed, the main latch data MDLT is logic low, while if the LSB is "0", the main latch data MDLT is logic high.

Further, during the data-out interval T37, when the selection address Yp is generated as a high level (t37), the main latch data MDLT is mapped to the internal data line IDOUT. That is, if an LSB is "0", the internal data line IDOUT maintains a logic high level. In contrast, if the LSB is "0", the internal data line IDOUT is adjusted to a logic low level.

In the data reading method for the nonvolatile semiconductor memory device according to the present invention in FIG. 12, it should be noted that the secondary mapping of the threshold voltage of die memory cell MCsel to the bit line BL is performed on the bit line BL on which the primary mapping has been performed. That is, the second bit line mapping interval T35 is performed, omitting an operation of precharging the bit line BL to a predetermined voltage during or after the first bit line mapping interval T33 and the first flip interval T34.

As described above, in the data reading method for a nonvolatile semiconductor memory device according to an embodiment of the present invention, an operation of precharging the bit line BL before the second bit line mapping interval T35 can be omitted for the reasons described below.

First, if the data is "10", "00" or "01", the memory cell MCsel is an off-cell during the first bit line mapping interval T33. Therefore, during the second bit line mapping interval T35, the bit line BL and the sensing terminal NSEN maintain previously precharged levels. That is, similar to a state in which precharge has been performed, the second bit line mapping interval T35 is performed.

Next the case in which the data is "11" is described. During the first flip interval T34, the main latch data MDLT is flipped to a logic low level. Therefore, the verification as to whether the main latch data MDLT is flipped during the second flip interval T36 does not influence a read data value. Therefore, if the data is "11", the second bit line mapping interval T35 is not concerned.

Consequently, in the data reading method for the nonvolatile semiconductor memory device according to embodiments the present invention, an operation of precharging the bit line BL before the second bit line mapping interval T35 can be omitted.

Meanwhile, the reading of an MSB for the nonvolatile semiconductor memory device of the present invention can be implemented trough the page buffer set interval T31, a precharge interval T32, a first bit line mapping interval T33, and a data-out interval T37 of previously described FIG. 12. In this case, however, the second reference voltage VR2 is applied at the time of bit line mapping. Therefore, the method of reading an MSB is otherwise similar to that of reading an MSB, a detailed description of the MSB reading omitted here to avoid redundancy.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

For example, in the present description, embodiments using the same LSB with respect to data values mapped to first and second threshold voltage groups having sequentially increasing voltages are shown and described. However, the technical spirit of the present invention can be implemented by embodiments that use the same MSB with respect to data values mapped to the first and second threshold voltage groups.

Therefore, the technical scope of the present invention should be defined by the accompanying claims.

As described above, the present invention provides a nonvolatile semiconductor memory device, which includes a page buffer for latching main latch data and sub-latch data. In this case, a control operation is performed to interrupt the flipping of the main latch data according to the logic state of the sub-latch data. Further, the page buffer includes a latch control block that performs a control operation to selectively flip the main latch data depending on the voltage level of a bit line and is disabled in response to the logic state of the sub-latch data.

Further, a data reading method for the nonvolatile semiconductor memory device of the present invention includes the steps of primarily mapping the threshold voltage of a memory cell to a bit line on the basis of a first reference voltage, and secondarily mapping the threshold voltage of the memory cell to the bit line on the basis of a third reference voltage. In this case, the secondary mapping of the threshold voltage of the memory cell is implemented on the bit line to which the threshold voltage of the memory cell has been pimarily mapped. That is, an operation of recharging the bit line to a specific voltage is omitted between the primary mapping step and the secondary mapping step.

Accordingly, the nonvolatile semiconductor memory device and data reading method for the same are advantageous in that the number of bit line precharge operations is reduced at the time of reading the LSB data, thus shortening the time required to read data.

What is claimed is:

1. A nonvolatile semiconductor memory device, comprising:
   a memory array including a plurality of nonvolatile memory cells, a bit line, and a word line;
   a page buffer electrically connected to the bit line and including a main data latch and a sub-data latch, the page buffer configured such that flipping of the main data latch is inhibited according to a logic state of the sub-data latch; and
   a row decoder driven to control a word line of the memory array,
   wherein the page buffer comprises,
   a main latch block which drives the main data latch and which maps a logic state of the main data latch to a threshold voltage of a corresponding memory cell through the bit line,
   a sub-latch block which drives the sub-data latch, wherein the sub-data latch is flipped depending on the voltage level of the bit line, and
   a latch control block which selectively flips the main data latch depending on the voltage level of the bit line, wherein the latch control block is disabled depending on a logic state of the sub-data latch.

2. The nonvolatile semiconductor memory device according to claim 1, wherein the main latch block comprises a main latch unit for setting the logic state of the main data latch, a main response unit for driving the main latch unit to flip the main data latch depending on the voltage level of the bit line, and a loading unit for loading a logic state into the main data latch, and
   wherein the sub-latch block comprises a sub-latch unit for setting the logic state of the sub-data latch, a sub-response unit for driving the sub-latch unit to flip the sub-data latch depending on the voltage level of the bit line, a reset unit for resetting the sub-data latch.

3. The nonvolatile semiconductor memory device according to claim 2, wherein the main latch unit comprises a plurality of transistors for controlling a direction in which the main data latch is flipped by the main response unit.

4. The nonvolatile semiconductor memory device according to claim 1, wherein the page buffer further comprises an output driver for mapping the logic state of the main data latch to an internal data line.

* * * * *